United States Patent
Wang et al.

(10) Patent No.: US 10,401,823 B2
(45) Date of Patent: Sep. 3, 2019

(54) REAL TIME MACHINING PROCESS MONITORING UTILIZING PREPROCESS SIMULATION

(71) Applicant: Makino Inc., Mason, OH (US)

(72) Inventors: Zhigang Wang, Mason, OH (US); Shogo Nakashima, Mason, OH (US); Mark W. Larson, Hamilton, OH (US)

(73) Assignee: Makino Inc., Mason, OH (US)

( * ) Notice: Subject to any disclaimer, the term of this patent is extended or adjusted under 35 U.S.C. 154(b) by 199 days.

(21) Appl. No.: 15/015,860

(22) Filed: Feb. 4, 2016

(65) Prior Publication Data

US 2017/0227945 A1    Aug. 10, 2017

(51) Int. Cl.
*G05B 19/18* (2006.01)
*G06F 17/50* (2006.01)
*G05B 19/402* (2006.01)

(52) U.S. Cl.
CPC ......... *G05B 19/182* (2013.01); *G05B 19/402* (2013.01); *G06F 17/5009* (2013.01); *G05B 2219/49001* (2013.01)

(58) Field of Classification Search
CPC ................................................. G05B 19/182; G05B 19/402; G05B 17/5009; G06F 17/5009
See application file for complete search history.

(56) References Cited

U.S. PATENT DOCUMENTS

| | | | |
|---|---|---|---|
| 4,748,554 A | 5/1988 | Gebauer et al. | |
| 4,787,049 A | 11/1988 | Hirata et al. | |
| 4,833,617 A | 5/1989 | Wang | |
| 5,374,884 A | 12/1994 | Koren et al. | |
| 5,598,076 A | 1/1997 | Neubauer et al. | |
| 5,631,851 A | 5/1997 | Tanaka et al. | |
| 6,266,572 B1 * | 7/2001 | Yamazaki | G05B 19/4069 700/159 |
| 6,269,284 B1 | 7/2001 | Lau et al. | |

(Continued)

FOREIGN PATENT DOCUMENTS

| JP | H07-132440 A | 5/1994 |
|---|---|---|
| TW | 501172 B | 9/2002 |

(Continued)

OTHER PUBLICATIONS

Wang, Zhigang et al., "Model Development for Cutting Optimization in High Performance Titanium Machining", 2013, Makino, Inc., pp. 1-16.

(Continued)

*Primary Examiner* — Vincent H Tran
(74) *Attorney, Agent, or Firm* — Frost Brown Todd LLC

(57) ABSTRACT

A pre-process simulation may calculate operating conditions of a machine tool by simulating a NC program and calculate predicted values indicative of the operating conditions. A real time monitoring system may compare actual values from the actual operation of a machine tool actually executing the NC program to the predicted values and determine whether to initiate a response. The operating conditions may be machine tool operating conditions. The comparison of actual values to predicted values may be based on a dynamic limit within which the predicted values fall which may vary based on the tool position, and the dynamic limit may include upper and lower limit boundaries.

35 Claims, 7 Drawing Sheets

(56) References Cited

U.S. PATENT DOCUMENTS

| | | | |
|---|---|---|---|
| 6,291,959 B1* | 9/2001 | Yoshida | G05B 19/404 318/567 |
| 6,502,007 B1 | 12/2002 | Kanamoto et al. | |
| 6,512,961 B1 | 1/2003 | Fukaya et al. | |
| 6,584,415 B1* | 6/2003 | Uneme | G05B 19/4065 702/33 |
| 6,662,073 B1* | 12/2003 | Fujishima | G05B 19/4069 700/109 |
| 6,671,571 B1 | 12/2003 | Matsumiya et al. | |
| 6,885,984 B1 | 4/2005 | Suzuki et al. | |
| 6,889,114 B2 | 5/2005 | Nakamura | |
| 6,909,937 B2 | 6/2005 | Sugiyama et al. | |
| 6,985,792 B2 | 1/2006 | Tomelleri | |
| 7,219,041 B2 | 5/2007 | Hamann | |
| 7,260,446 B2 | 8/2007 | Besuchet | |
| 7,477,960 B2 | 1/2009 | Willis et al. | |
| 7,933,679 B1* | 4/2011 | Kulkarni | G05B 13/0265 700/173 |
| 7,979,254 B2 | 7/2011 | Ohashi et al. | |
| 8,010,328 B2 | 8/2011 | Frisken et al. | |
| 8,014,892 B2 | 9/2011 | Glasser | |
| 8,090,557 B2 | 1/2012 | Koch et al. | |
| 8,229,594 B2 | 7/2012 | Ichikawa | |
| 8,271,118 B2 | 9/2012 | Pietsch et al. | |
| 8,326,448 B2 | 12/2012 | Schneider | |
| 8,380,462 B2 | 2/2013 | Jalluri et al. | |
| 8,538,574 B2 | 9/2013 | Hahn | |
| 8,655,476 B2 | 2/2014 | Wang | |
| 8,655,479 B2 | 2/2014 | Coffignal et al. | |
| 8,666,533 B2 | 3/2014 | Lorenz et al. | |
| 2004/0267508 A1 | 12/2004 | Huang et al. | |
| 2009/0204249 A1* | 8/2009 | Koch | G05B 19/4097 700/108 |
| 2013/0253694 A1 | 9/2013 | Chung et al. | |
| 2014/0025192 A1* | 1/2014 | Seya | G05B 19/4063 700/174 |
| 2014/0129024 A1 | 5/2014 | Lee et al. | |
| 2014/0288692 A1* | 9/2014 | Kawashima | G05B 19/40937 700/160 |
| 2014/0371905 A1 | 12/2014 | Eberst et al. | |
| 2015/0039122 A1* | 2/2015 | Barakchi Fard | G06F 17/5009 700/186 |
| 2015/0088301 A1 | 3/2015 | Erdim et al. | |
| 2015/0127139 A1 | 5/2015 | Bolin et al. | |
| 2015/0227133 A1 | 8/2015 | Kurohara | |
| 2015/0268661 A1* | 9/2015 | Ogawa | G05B 19/4097 700/182 |

FOREIGN PATENT DOCUMENTS

| | | |
|---|---|---|
| TW | 533467 | 5/2003 |
| TW | 579424 B | 3/2004 |
| TW | I379074 | 12/2012 |
| TW | 201319527 A | 5/2013 |

OTHER PUBLICATIONS

International Search Report and Written Opinion dated Jun. 29, 2017 for Application No. PCT/US2017/016382, 14 pgs.

* cited by examiner

REAL TIME MACHINING PROCESS MONITORING UTILIZING PREPROCESS SIMULATION

TECHNICAL FIELD

The present disclosure relates generally to machine tools. Specifically disclosed is a method and apparatus which simulates execution of a NC program and resultant operating conditions of at least the machine tool, and generates data predictive of the values of such operating conditions. Also disclosed is a method and apparatus which compares operating conditions that exist during actual machining with predicted values of the operating conditions.

BACKGROUND

Computer control of a machining system that involves the CAD/CAM based support has been widely accepted to improve productivity and reduce production cost. Recently, more intelligent functions have been developed and integrated into CNC machine tools. CAD/CAM provides the facilities to create and monitor tool paths to use on the workpiece. In some CAM software programs, machine tools and machine virtual environments can be utilized to dynamically simulate the machining operations. These dynamic simulations provide NC program generation and verification, material removal analysis and collision detection error. With the process simulation, the tool path can be analyzed and verified before actually machining the part. It has become easier to machine complex parts more accurately and more quickly with the advancement of simulation tools. However, in selection of machining strategies, the methods offered by CAM software often are based on the parts' geometrical information with little or no consideration of the machine tool capability or the physics of metal cutting. On the other hand, machine tools (or operators) have limited information about NC programs, hence it is difficult to judge whether machining is performed properly. Running machine tools under undesirable operating conditions can cause damage to tools, the machine tools or workpiece. Operating at, near or over the machine limits, for a short time or over a long period of time, can lead to damage to the tool, the machine tool or workpiece.

Moreover, in practice, operating parameters are still mainly selected based on either on machining handbooks and/or tool manufacturer's catalogues which are typically very conservative and aggressive, respectively. Therefore, it has been difficult to perform the machining under an optimal condition, which either leads to low productivity or deterioration in machining accuracy and surface roughness. Moreover, when the tool is a cutting tool which is engaged in cutting with a rapidly increasing cutting load, damage easily occurs to the cutting tool as well as work material to be machined.

BRIEF DESCRIPTION OF THE DRAWINGS

The accompanying drawings together with specification, including the detailed description which follows, serve to explain the principles of the present invention.

DETAILED DESCRIPTION

Figure 1:
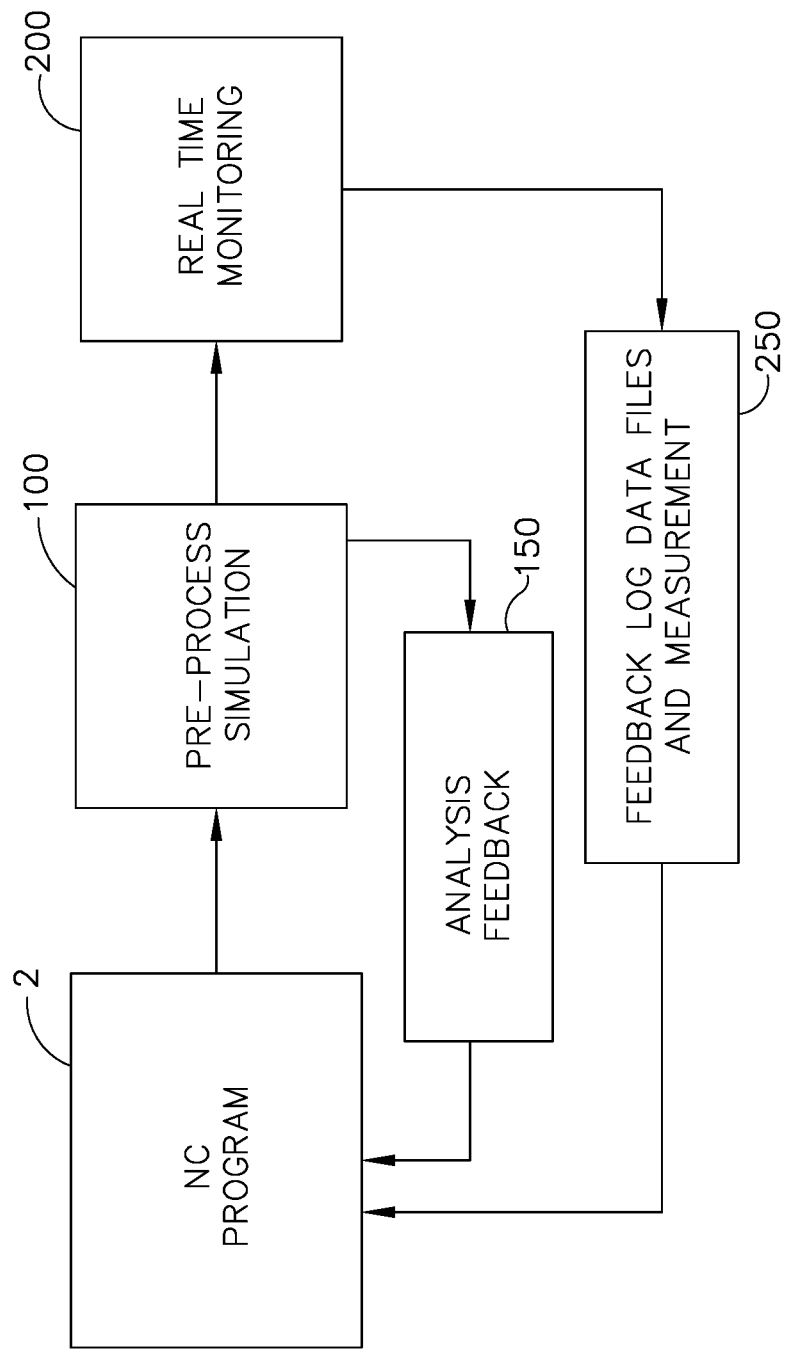
FIG. 1 is a block diagram according to an aspect of the invention.

In the following description, like reference characters designate like or corresponding parts throughout the several views. Also, in the following description, it is to be understood that terms such as front, back, inside, outside, and the like are words of convenience and are not to be construed as limiting terms. Terminology used in this patent is not meant to be limiting insofar as devices described herein, or portions thereof, may be attached or utilized in other orientations. Referring in more detail to the drawings, an embodiment constructed according to the teachings of the present invention is described.

As used herein, tool refers to any type of tool which may be carried by a tool holder of a machine tool and manipulated by the machine tool to alter the characteristics of a workpiece. Although herein a cutting tool is frequently referenced in describing aspects and/or embodiments of the invention hereof, as used herein, tool is not limited to any specific type of tool, and references to cutting tool are to be considered and interpreted as not limiting the invention hereof to operations of a machine tool involving cutting unless specifically so limited. Although cut or cutting can mean the removal of material from a workpiece by means of shear deformation, as used herein, cut and cutting is to be considered and interpreted as not limiting the invention hereof to removal of material by means of shear deformation, unless specifically so indicated, but instead is to be considered and interpreted as an operation which alters any characteristic of a workpiece. Although a spindle is frequently referenced in describing aspects and/or embodiments of the invention hereof, as used herein, spindle is not limited to any specific type of tool holder, and references to tool holder are to be considered and interpreted as not limited to any specific type of tool holder. To the extent necessary, the disclosure as explicitly set forth herein supersedes any conflicting material incorporated herein by reference.

FIG. 1 is block diagram illustrating an aspect of the invention. Starting with NC program 2, simulation 100 may calculate conditions resulting from the simulated execution of NC program 2. If simulation 100 indicates an undesirable condition (i.e., a condition which may lead to an undesirable result) exists, feedback of the analysis of the results from simulation 100 may be used at 150 to revise NC program 2, and simulation 100 may proceed to simulate revised NC program 2. Simulation 100 may iteratively simulate successive revisions of NC program 2 until no undesirable conditions are indicated by simulation 100 to exist, and generate data indicative of calculated conditions, which represent the predicted values of those conditions. The latest version of NC program 2 may actually be executed by a machine tool controller to cause the machine tool to machine a workpiece. During operation of a machine tool, information regarding the actual operating conditions existing during machining of the workpiece may be evaluated in real time by real time monitoring system 200 relative to predicted values, which may have been calculated by simulation 100. If the actual operating conditions are not within an acceptable range of the predicted values, feedback data indicative thereof may be generated at 250, and the machining may be interrupted.

Figure 2:
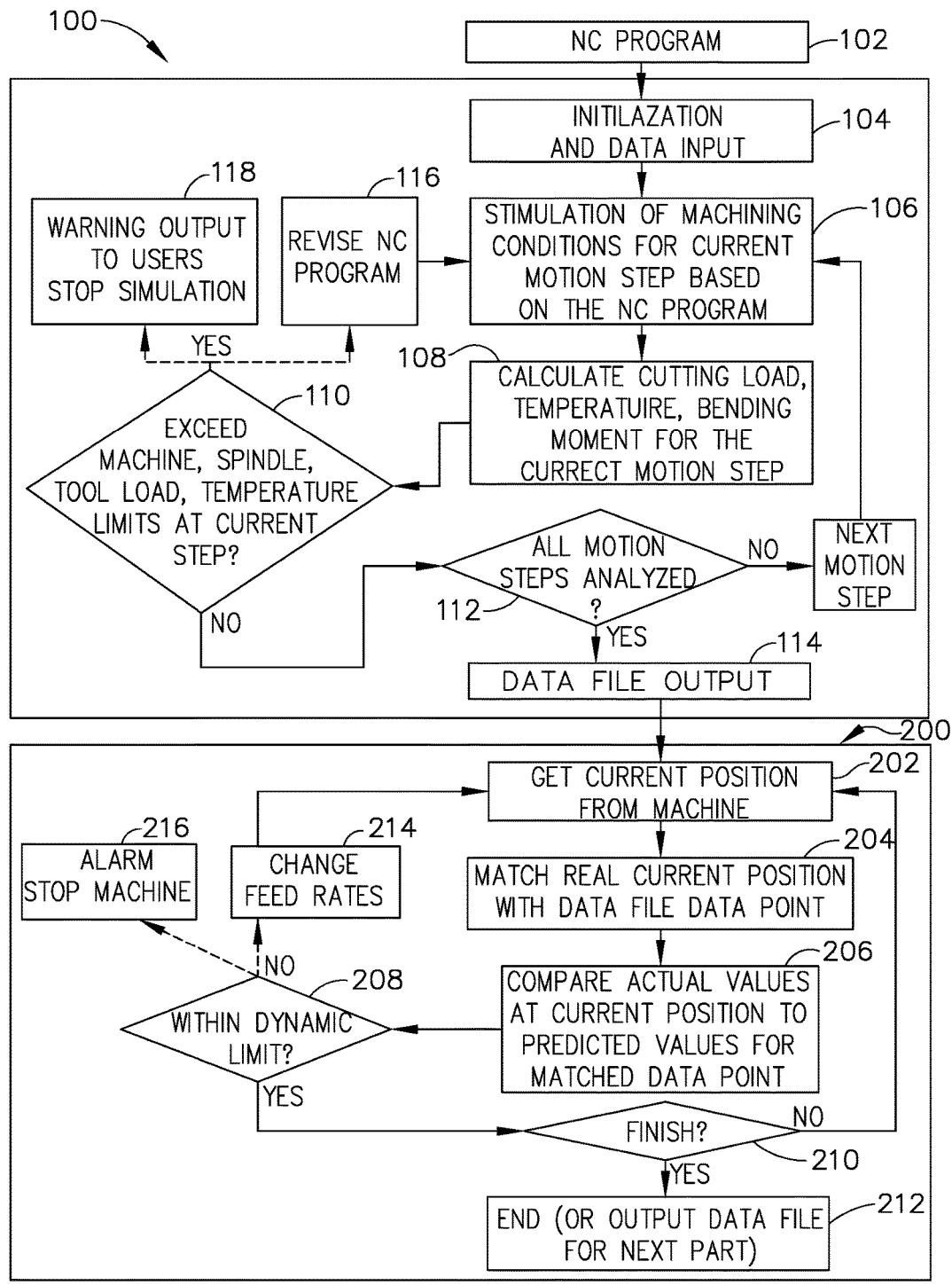
FIG. 2 illustrates a flow diagram of a simulation according to one of the aspects of the invention and of a method for real time monitoring of the machining process according to another of the aspects of the invention.
Figure 5:
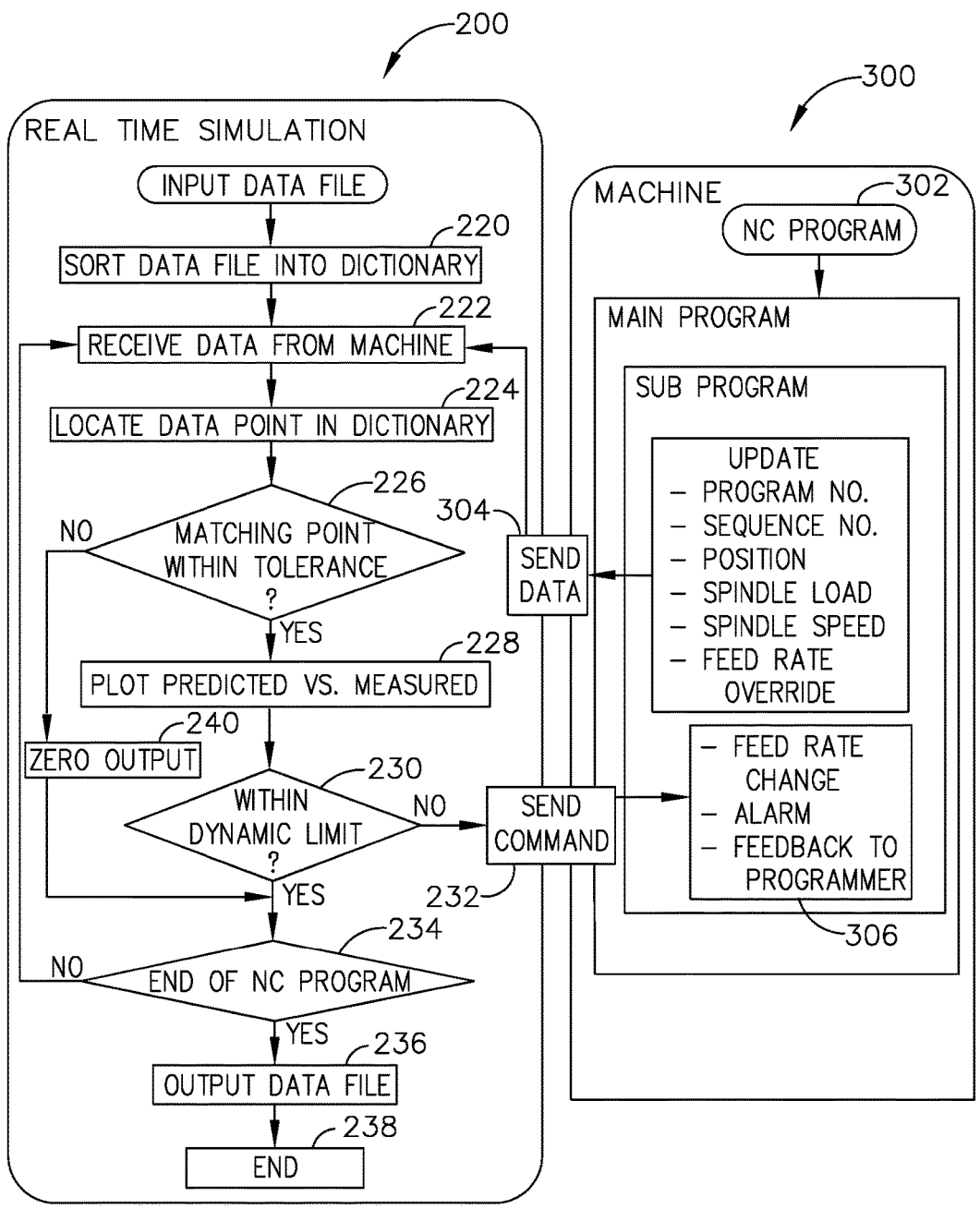
FIG. 5 is a flow diagram of an embodiment of the monitoring of FIG. 1.

Referring to FIG. 2, two flow diagrams illustrate pre-process simulation 100 according to one of the aspects of the invention and real time monitoring system 200 according to another of the aspects of the invention. Although pre-process simulation 100 and monitoring system 200 are illustrated in conjunction with each other, either simulation 100 or monitoring system 200 may be practiced independent of the other. Pre-process simulation 100 simulates the execution of an NC program in a virtual environment in which a machine tool operates the tools designated in the NC program to follow a tool path, including feed rates, tool angles, etc. Pre-process simulation 100 may model the cutting path and relevant conditions, such as the feed rates, spindle speeds and depth of cut, based on tool attributes such as tool kind, size and geometry and on material composition, and calculate the geometrical material to be removed. Pre-process simulation 100 may identify simulated operating conditions which may lead to undesirable results so that the NC program is or may be revised to reduce or eliminate the potential for such undesirable results, and may calculate predicted values for certain operating conditions based on the simulation of a final revision of the NC program for which pre-process simulation 100 does not identify conditions which may lead to undesirable results. Such predicted values may be provided to real time monitoring system 200 and the revision of the NC program may be provided to the machine tool controller. As FIGS. 2 and 5 illustrate, data generated by pre-process simulation 100 may be passed to real time monitoring system 200, and the final revision of the NC program may be loaded into machine tool controller 300. Real time monitoring system 200 may be executed real time in conjunction with the actual in-process machining of a workpiece on the machine tool, compare the predicted values with the actual values from the actual machining, and respond based on that comparison.

As illustrated in FIG. 2, NC program 102 is provided to pre-process simulation 100. NC program 102 may be of any origin, such as may be generated in whole or in part by a CAD/CAM system or created in whole or in part manually. As indicated at 104, pre-process simulation 100 may be initialized for the particular computing environment, and loaded with data relevant to the actual machine tool, tool, work piece and final part, such as, but not limited to, tool attributes such as for example tool shape, diameter, number of flutes, helix angle, etc., which may be organized in a predefined table of tool geometries; machine tool attributes such as, but not limited to, axis configuration, spindle torque-power curve, axis stroke, etc.; workpiece attributes such as, but not limited to, stock material shape, material properties, and material specific cutting pressure coefficients; and final part configuration such as, but not limited to, in the form of a solid model. Initialization of pre-process simulation 100 may occur only as needed—not necessarily every time pre-process simulation 100 is executed. Relevant data may be inputted in any manner at any time, such as some data inputted by the end user at the time of simulation. Some relevant data may be selectable by an end user through drop down lists.

In the embodiment depicted, pre-process simulation 100 simulates the machining process based on the NC program, motion step by motion step. The simulation and associated calculations to model the execution of each motion step of the NC program is represented at step 106. For each motion step of the NC program, pre-process simulation 100 may calculate machining conditions for the current motion step. As used herein, motion step refers to a change of the position of the tool relative to the workpiece. The motion step resolution of pre-process simulation 100 may be set during step 104. Machining conditions comprise information relevant to the subsequent calculation at step 108 of operating conditions which may lead to undesirable results, such as damage to the tool, the machine tool or workpiece, or inaccuracy of the machining process. At step 106, pre-process simulation 100 may calculate the volume of material removed and the cutting tool-material contact area based on the geometrical Boolean operation. Based on the calculated material removal and contact area, simulation 100 may calculate the axial depth of cut and width of cut. The chip load for each flute of the tool may also be calculated based on attributes of the motion step of the NC program being simulated, such as operational attributes such as feed rate and spindle speed and such as tool attributes such as the number of flutes of the cutting tool. The radial engagement may be calculated based on the cutting tool diameter. Simulation of an NC program in this manner is well known in the art, and can be implemented by any of several commercially available existing CAM simulation programs including for example Vericut Optipath software available from CGTech.

In the embodiment depicted, as illustrated in FIG. 2, after the simulation of machining conditions for the current motion step at step 106, simulation 100, at step 108, may calculate values of one or more operating conditions which could lead to undesirable results, such as result in damage to cutting tools, the machine tool or the workpiece if the machine tool were to continue to operate at or above that value. Such operating conditions include tool operating conditions and/or machine tool operating conditions, which may include but are not limited to any of cutting forces, spindle power, radial load at the spindle (e.g., at the spindle bearings), tool deflection, bending moment on the tool, bending moment on the spindle or at the spindle interface, cutting torque at the tool holder/spindle interface, temperature of the tool, load on one or more of the machine tool axes servos. Such operating conditions may be based on one or more machining conditions of the current motion step simulated at step 106 as described above. In an embodiment, information relevant to the subsequent calculation of operating conditions may be simulated at step 106 by an existing program and relevant data extracted to form the basis for the calculation at step 108. Each of the calculations at step 108 may be considered a predicted value of each such respective operating condition of the specific motion step which is being simulated, and is also referred to herein as predicted value.

At step 110, simulation 100 determines, for the current motion step, whether any predicted value calculated at step 108 exceeds a limit, which may be a predetermined limit, which is relevant to that operating condition. In more general terms, simulation 100 makes a determination for the current motion step whether to continue the simulation of the NC program in its then current form based on whether an assessment of one or more predicted values relative to predetermined criteria indicates an undesirable operating condition, such as an operating condition that will or might lead to damage to the tool, the machine tool or workpiece, or lead to inaccuracy of the machining process. Such an assessment may, for example, be a comparison of the predicted values to machine tool specifications (e.g., power and torque limits), thrust force limit for one or more drive axis and cutting tool limits, such as but not limited to cutting tool's characteristic temperature below which the cutting tool material can maintain its mechanical strength, and workpiece attributes. Such assessment may include whether the respective predicted values are outside of respective predetermined tolerances of the limit.

If the predicted values for the current motion step are considered acceptable relative to the relevant limits plus any tolerances, simulation 100 may proceed to step 112, where simulation 100 may consider whether all motion steps have been analyzed, and if all motions steps have not been analyzed, may proceed to the next motion step, returning to step 106 to repeat steps 106, 108 and 110 for the next motion step. Once all motion steps have been analyzed, simulation 100 may proceed to step 114 from step 112 and create a data file containing the predicted values for each motion step. The data file may have any suitable structure.

If, at step 110, it is determined that simulation of the NC program in its current form should not continue, revision to the NC program may be necessary for one or more motion steps. Such revision may be necessary for the current motion step, may be necessary for one or more previous motion steps, and/or may be necessary for one or more subsequent motion steps.

Simulation 100 may create such revision to the NC program automatically at step 116, proceeding from step 110 to step 116 as indicated by the dashed line. For example, simulation 100 may reduce the feed rate. Simulation 100 may then return to an appropriate step of simulation 100. For example, if at step 116 no revisions were implemented that affected one or more motion steps prior to the current motion step, then simulation 100 may proceed to step 106 and proceed with the simulation beginning at the revised current motion step. If at step 116, one or more motion steps prior to the current motion step is revised, simulation 100 may proceed to step 106 and proceed with the simulation beginning at an appropriate motion step such as, for example, the earliest revised motion step, or simulation 100 may proceed to an earlier step in the simulation, such as for re-initialization, data input, etc. Simulation 100 may proceed to step 106 and proceed at the first motion step regardless of what motion steps were revised. If the revision required a change in initialization or data input at step 104, simulation 100 may proceed to step 104.

Alternately, simulation 100 may not automatically create a revision to the NC program. If not, then simulation 100, proceeding from step 110 to step 118 as indicated by the dashed line, may stop the simulation and provide an output indicating that simulation 100 determined that continuation of the simulation of the NC program in its current form should not continue. Such output may be in humanly perceptible form, such as an audible or a visual alarm, a pop up notice on a screen, etc. or may be in a form usable by system responsive to the form of the output. Revision to the NC program may be created, such as by a programmer, and simulation 100 restarted or resumed at an appropriate step.

Alternately, simulation 100 may provide, following a yes at step 110, for proceeding to step 116 under certain circumstances and proceeding to step 118 under other circumstances.

It is noted that if there are any revisions to the NC program following step 110, simulation 100 simulates, at some point, all or part of the revised NC program. It is also noted that the embodiment of simulation 100 depicted is but one way in which predicted values may be calculated based on an NC program. For example, step 106 could be executed for every motion step, followed by executing steps 108 and 110 for every motion step, or executing step 108 for every motion step then proceeding to step 110 for every motion step and reporting every condition that exceeds a predetermined limit.

Figure 3:
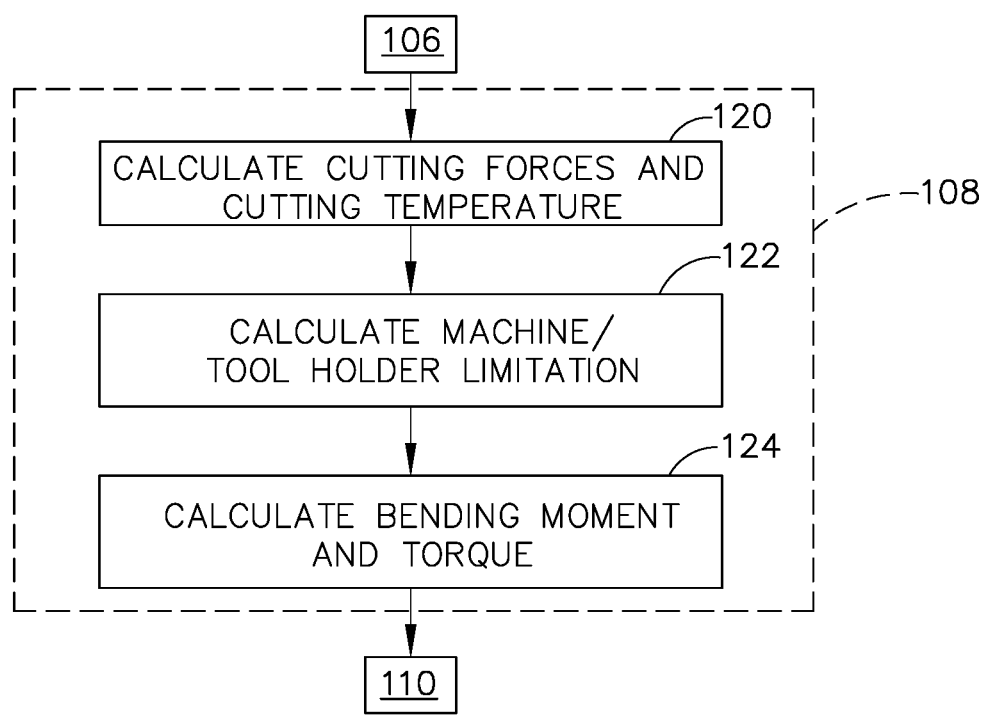
FIG. 3 is a flow diagram of an embodiment which could be part of the pre-process simulation of FIG. 2.

FIG. 3 illustrates an embodiment which could comprise step 108 of pre-process simulation 100. Following step 106 as described above, at step 120 the cutting forces and temperature may be calculated for the current motion step. At step 122, for each motion step, the power and torque limit of the machine tool is calculated based on the spindle rotation speed for the current motion step. At step 124, the bending moment and torsional torque applied to the tool holder/spindle interface are calculated. These may be calculated, for example, based on the calculated load and gauge length of the cutting tool.

Figure 4:
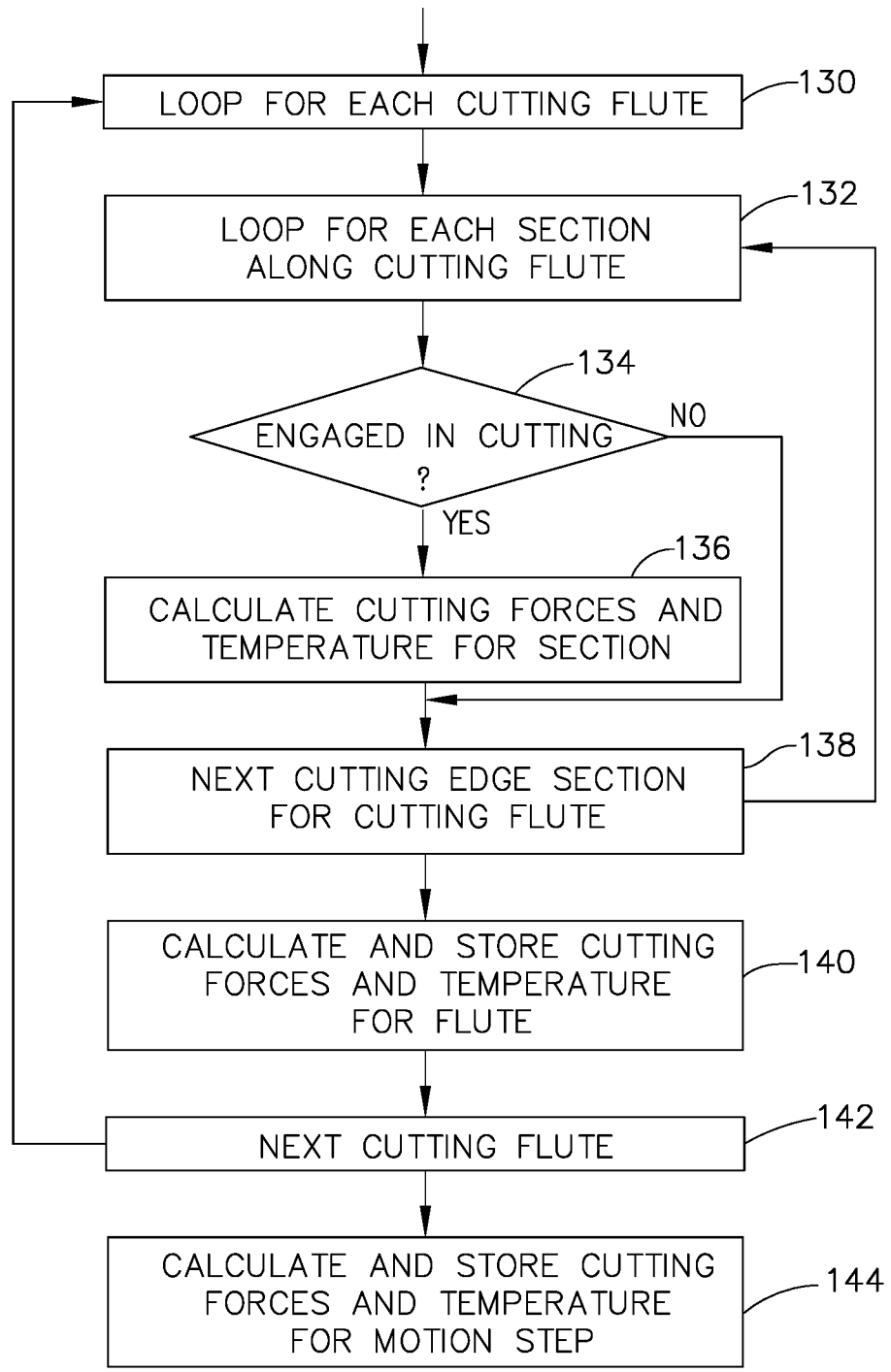
FIG. 4 is a flow diagram of an embodiment which could be part of the pre-process simulation of FIG. 2.

FIG. 4 illustrates an embodiment which could comprise steps executed as part of step 108. A cutting tool may have one or more cutting edges, each referred to herein as a flute. The cutting load is distributed along each cutting edge that engages material in a motion step, along the portion of the cutting edge which is engaged with material. The cutting load and temperature may be calculated by analyzing small sections along each cutting edge. For each such small section, the cutting load and temperature may be calculated based on the chip load, cutting speed, radial engagement, cutting tool geometry and work material properties for that small section. FIG. 4 indicates at 130 that for each motion step, each flute may be analyzed. At 132, it is indicated that for each such flute, each small section along the flute may be analyzed. At step 134 it may be determined whether the current section is engaged in cutting. If it is not engaged, the analysis may proceed to the next section indicated by 138. If the current section is engaged in cutting, at step 136, the temperature and force, such as at the spindle interface or the tool, for the section may be calculated. At 138, the analysis may proceed to the next small section of the current flute, and loop back to step 132 to repeat the process until all small sections of the current flute have been considered. After all small sections have been considered, the cutting forces and temperature for the flute may be calculated and stored at step 140. The force for the flute may be the sum of the forces calculated for each section. The temperature may be the maximum temperature calculated for any section of the flute. Alternately, forces could be summed and temperatures compared with each pass through the loop for each section. If not all flutes of the current motion step have been considered, the analysis may proceed to the next flute that engages material during the current motion step at 142. After all flutes of the current motion step have been considered, the forces and temperature may be calculated at 144 for the motion step. Temperature may be calculated based only on or for only the maximum chip load during the motion step. The temperature for the current motion step may be the highest temperature calculated during the analysis described in this paragraph. Alternatively, forces could be summed and temperatures compared with each pass through the loop for each flute.

Calculation of temperature may be done using any methods known in the art. As is known, once shear and friction forces are known from force calculations, shearing power and friction power may be calculated with these two forces times shear velocity and chip flow speed, respectively. The shear plane temperature may be calculated based on the assumption that all shearing power is converted to heat, which may be done according to the formula $$T_s - T_r = \frac{F_s v_s}{bhv\rho c} = \frac{K_C \cos\theta}{\cos(\theta - \phi)} \frac{\cos\alpha}{\cos(\phi - \alpha)} \frac{1}{\rho c} \quad (1)$$

where: $T_s$ is the shear plane temperature
$T_r$ is the reference room temperature
$F_s$ is shear force
$v_s$ is shear velocity
b is chip width
h is chip thickness
v is cutting speed
ρ is density of the work material
c is the specific heat
$K_C$ is the specific cutting pressure,
α is rake angle
φ is the shear angle
θ is the angle made by resultant force and shear plane
All of these parameters can be obtained from the force calculation. Once the shear plane temperature is known, the temperature field along the tool-chip interface can be calculated.

Returning to FIG. 2, monitoring system 200 is also referred to herein as real time monitoring system 200 in that monitoring process 200 may be executed in conjunction with the real time actual in-process machining of the workpiece on the machine tool. When a proved NC program and predicted values of conditions which would not lead to undesirable results such as result in damage to cutting tools, the machine tool or the workpiece for each motion step of the NC program, are available, such as from pre-process simulation 100, real time monitoring 200 may be executed simultaneously with the actual machining of the part. It is noted that the proved NC program and predicted values for each motion step do not have to come from execution of pre-process simulation 100.

After predicted values correlated to the motion steps have been inputted and sorted into a data dictionary (see FIG. 5), and the NC program is loaded into the machine tool (see FIG. 5), at 202 the current position of the tool is received into real time monitoring system 200 from the machine tool. At 204, that position may be synchronized with the data file, by associating that position with a data point in the data dictionary. At 206, the actual (real time) values of the operating conditions corresponding to the predicted values (which may be obtained by measurement by sensors on the machine tool or by calculations based on such sensors as in the case of bending moment for example), such as forces and temperature, which are passed to real time monitoring system 200 from the machine tool, may be compared to the predicted values associated with the motion step corresponding to the current position of the tool. As used herein, "actual value" and "actual values" refer to the values of the operating conditions, such as but not limited to cutting loads and temperatures, that actually exist respectively for the machine tool and/or the tool, as directly or indirectly sensed or as calculated based on one or more sensors. Real time monitoring system 200 considers such actual values that correspond to predicted values. At 208, real time monitoring system 200 may determine whether all of the specific actual values are within a dynamic limit of the predicted value, such as 15%. If all are, then at 210 real time monitoring system 200 may consider whether the actual machining process is finished. If the actual machining process is not finished, real time monitoring system 200 may return to 202 and get the new current position from the machine tool and repeat the simulation. If the process is finished, then real time monitoring system 200 may end at 212, and all measured data may be saved, in any form such as a log file, which may be used as reference data for subsequent machining of the same part.

It may be determined at 208 that the actual values not are not within the dynamic limit of the predicted values, such as being higher than the upper value of the dynamic limit or being lower than the lower value of the dynamic limit. Actual values which are lower than the lower value of the dynamic limit may be indicative of a problem, such as a broken or missing tool, and real time monitoring system 200 may proceed to step 216 and output an alarm and/or a warning message, and may stop the machine waiting for user input.

In the case that any of the actual values are higher than the upper value of the dynamic limit, monitoring system 200 may proceed to step 214 and adjust the tool feed rate with the goal of lowering subsequent actual values to lower than the upper value of the dynamic limit. Monitoring system 200 may provide an alarm or notice, such as a pop up message on a screen, to indicate that action was taken at step 214. Monitoring system 200 may then proceed to step 202.

Monitoring system 200 may allow actual values of an operating condition to exceed its upper value of the dynamic limit or to be lower than its lower value of the dynamic limit for the then current position for a predetermined period of time. For example, following an adjustment to the feed rate at step 214, monitoring system 200 may execute the loop 202-204-206-208-214-202 for a period of time, which may be a predetermined period of time, even through the actual value that prompted the first tool feed rate adjustment in the chain is not lower than the upper value of the dynamic limit. During such a period of time, in one embodiment, monitoring system 200 may not make an adjustment, reaching step 202 after step 208 without making an adjustment to the tool feed rate, whether the actual value of an operating condition is higher than the upper value or is lower than the lower value of the dynamic limit.

Alternately, monitoring system 200 may not automatically make such an adjustment to the feed rate. For example monitoring system 200 may proceed to step 216, and an alarm and/or warning message may be outputted, such as a pop up message on a screen, and stop the machining process waiting for user input. In one embodiment, monitoring system 200 may not stop the machining process at step 216, but proceed to step 202, allowing the actual values of an operating condition to exceed its upper value of the dynamic limit or to be less than the lower value of the dynamic limit for the then current position for a predetermined period of time, similar to as described in the preceding paragraph.

FIG. 5 diagrammatically illustrates an embodiment of monitoring system 200 and interaction with machine tool controller 300. The proved NC program may be loaded into the machine tool controller 300 at 302 and may be executed to cause the machine tool to machine the part. The data file with the predicted values correlated to the motion steps of the NC program may be inputted and sorted into a data dictionary at 220. As the machine tool operates to machine a part, machine tool controller 300 may send data at 304 which is received by real time monitoring system 200 at 222. The data may include the current position of the tool and actual values of operating conditions corresponding to the predicted values. At 224 monitoring system 200 may search for a data point in the data dictionary that is the closest point to the current cutting tool position received from machine tool controller 300. If the distance between the current position and a point is determined at step 226 to be within a tolerance range, such as within the motion step resolution of simulation 100, a matching point is considered found. At 228 real time monitoring system 200 may visualize the actual values, the predicted values and the threshold range vs. the machining time. (An example of a simulation output comparison is illustrated in FIG. 7B, discussed below.) At 230, real time monitoring system 200 determines whether the actual values are within the dynamic limit. If the actual values are not within the dynamic limit, such as exceeding the upper value of the dynamic limit, at 232 a command may be sent to machine tool controller 300 to adjust the tool feed rate and/or set an alarm at 306. The feed rate change may be determined based on the ratio of the actual value to predicted value of the particular operating condition, so as to bring the actual value within the dynamic limit. The feed rate change may be implemented by machine tool controller 300 and the machining process may continue. If the actual values do not fall within the dynamic limit within a predetermined time period, for example five seconds, then the command given at 232 at the expiration of the predetermined time may be to stop the machining process. The predetermined time period could, for example, be zero seconds, in which case the command is given immediately. If the actual values are within the dynamic limit at 230, real time monitoring system 200 may determine at 234 whether it is at the end of the NC program, and return to step 222 if it is not. When the end of NC program is reached, monitoring system 200 may save all measured data as a file (see step 212) at 236, and stop at 238.

If the distance between the current cutting tool position and the closest data point considered at step 226 is not within the tolerance range, such as within the motion step resolution of simulation 100, the closest data point may not be considered a matching point at step 226, indicating a matching point is not found. If a matching point is not found at 226, which may mean for example a tool change command is being executed by machine tool controller 300 or the cutting tool is not engaged in cutting, a zero output may be made at 240 and real time monitoring system 200 may proceed to 234, without feedback to machine tool controller 300.

Figure 6:
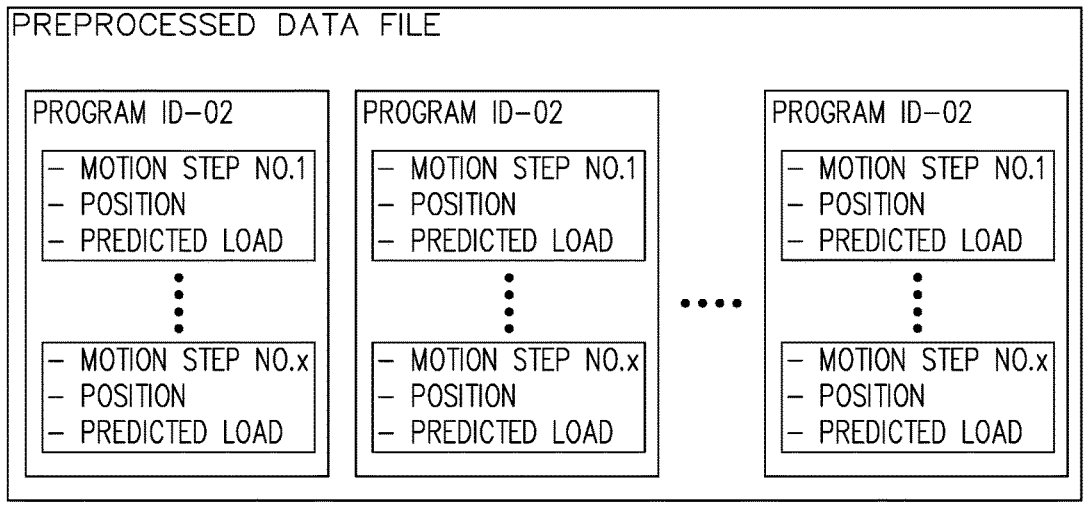
FIG. 6 is a representation of an exemplary data structure embodiment of a data file of the pre-process simulation of FIG. 1.

FIG. 6 illustrates an embodiment of a data structure of the data file outputted by pre-process simulation 100. FIG. 6 illustrates data organized as a data dictionary with Program ID, sequence number, associated tool position, and the cutting loads and temperatures. When a matching point to the data point sent from machine tool controller 300 to real time monitoring system 200 is searched, or synchronized as referenced at 204, it is searched in the data dictionary by matching the program ID and sequencing number. Then the matching data point is obtained by finding the closest point to the current cutting tool position.

Figure 7A:
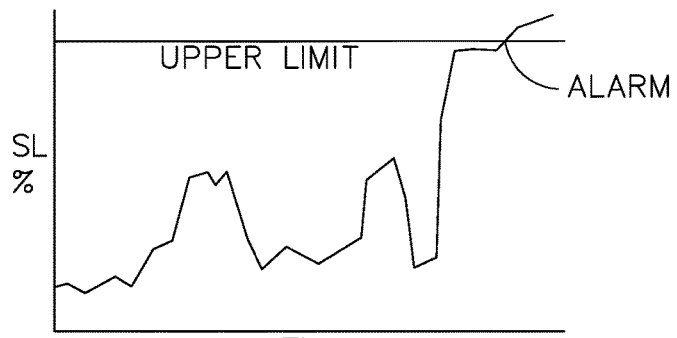
FIG. 7A is a diagrammatic illustration of a prior art method of applying a limit to measured loads of a machine tool, tool holder or tool.
Figure 7B:
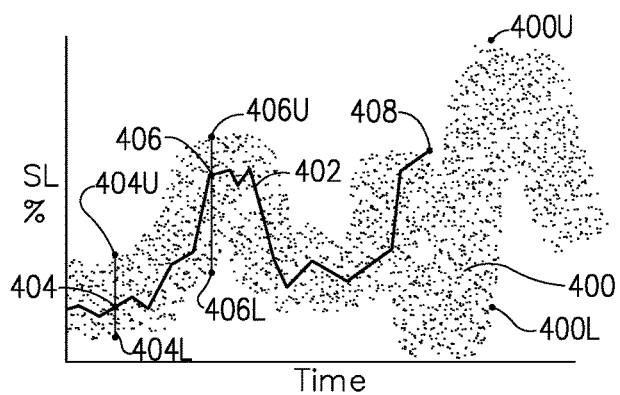
FIG. 7B is a diagrammatic illustration of a dynamic limit embodiment.

FIG. 7A illustrates a prior art method of setting an alarm limit for monitoring actual values, such as cutting loads, spindle power and axis loads of a machine tool during actual machining. A fixed upper alarm limit is set based on the maximum allowable value for the specific operating condition being monitored.

FIG. 7B illustrates an embodiment of an aspect of this invention, which may be practiced in conjunction with any embodiments discussed above, or completely separate therefrom. Shown in FIG. 7B is a dynamic limit envelope 400 which has an upper value, or upper limit boundary, 400U and a lower limit boundary 400L. A measured cutting load is represented by line 402, with the horizontal axis representing time. For each position of the cutting tool, there is a respective unique upper and lower limit for the load being monitored. For example, at point 404 which corresponds to an actual position of the tool during the machining process, there is an upper limit 404U and a lower limit 404L. If, when the tool is at the position corresponding to point 404, the load exceeds the value of upper limit 404U, an action will be initiated, such as setting an alarm or reducing feed rate. If the load is under 404L, such a condition may indicate an undesirable situation such as a broken tool, and an action may be taken. If the tool is at a position corresponding to point 406, the actual loading is higher than the lower limit 406L, but lower than the upper limit 406U for point 406, and no alarm or action will be initiated. Point 408 indicates that the measured load is higher than dynamic limit 400.

The upper and lower limits for each respective point may be determined in any suitable manner, such as, but limited to, based on a predicted value for the operating condition which may be determined through a simulation embodiment described herein, plus or minus a tolerance. Or, the predicted value for the operating condition for each position may be determined by any other methodology, and, in combination with a dynamic limit range, be used to set a dynamic limit for actual machining. FIG. 7B also illustrates an additional aspect of this embodiment, which may be incorporated with this embodiment, the display of the dynamic limit range of the machine tool, tool holder and/or tool for a period of time into the future.

Figure 8:
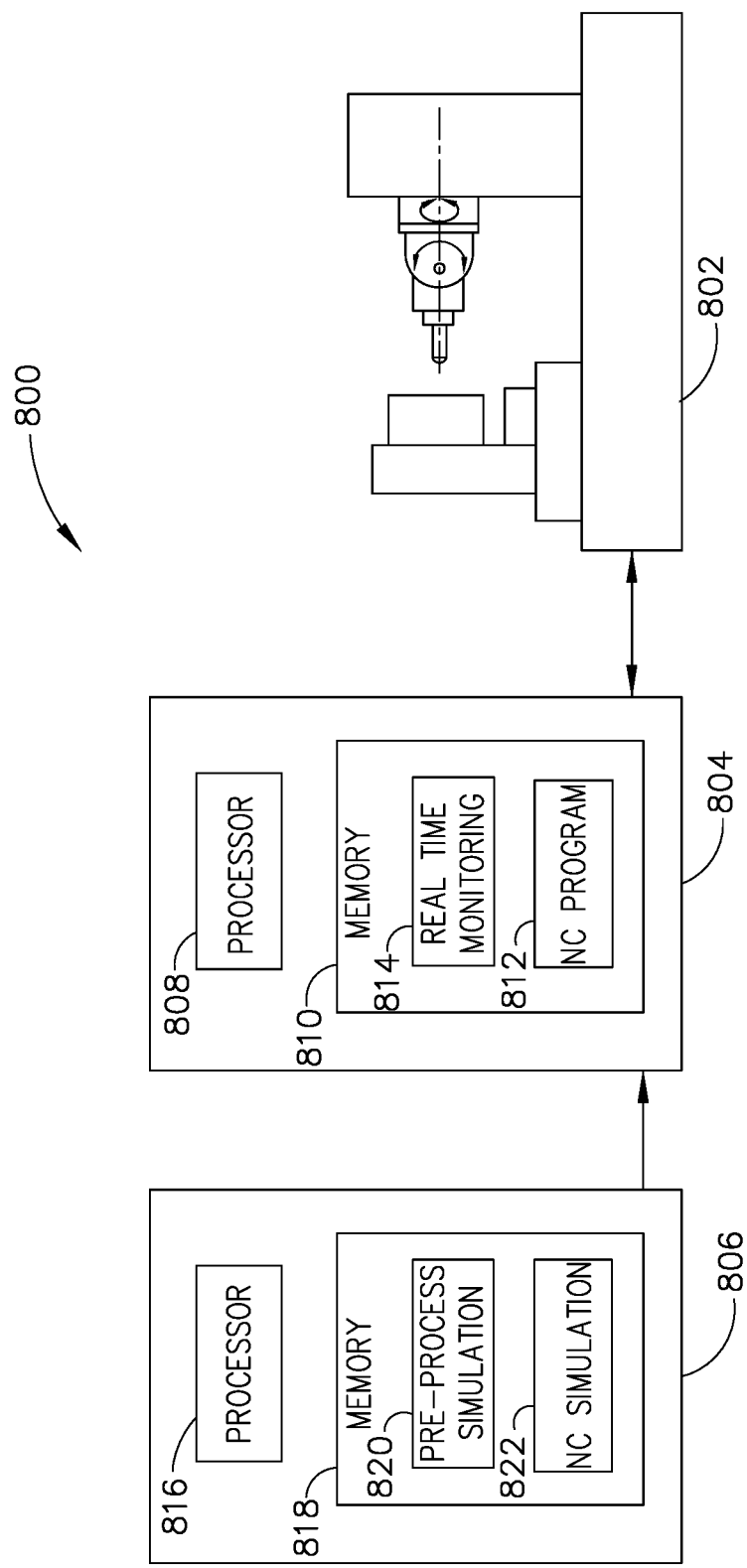
FIG. 8 is a diagrammatic illustration of an embodiment of a processor operating environment.

FIG. 8 illustrates an operating environment in which various embodiments and aspects of the disclosed technology can be deployed. The operating environment illustrated in FIG. 8 of machining system 800 includes machine tool 802, machine tool controller 804, and system 806. In operation, machine tool controller 804 may use its processor 808 to execute various programs stored in its memory 810, such as an NC program 812 and real time monitoring program or system 814. As set forth herein, this may include machine tool controller 804 generating instructions for controlling operation of machine tool 802 based on NC program 812, and receiving information on the operation of machine tool 802, such as actual operating conditions, which may measured by sensors (not shown in FIG. 8) on or near machine tool 802. This information may then be used by real time monitoring program 814 as described above, to determine if some type of action should be taken based on the operating conditions being outside of a predetermined acceptable dynamic limit range associated with the motion step in NC program 812 which has been matched to the then current position of the tool. Then, in the event that action was to be taken, real time monitoring program 814 may implement that action either independently (e.g., by causing an alert to be presented to a user) or in combination with one or more other programs (e.g., by acting as a hypervisor and stopping or altering the operation of NC program 812 on a previously created virtual machine tool controller instance). System 806 may operate in a similar manner, with its processor 816 executing programs stored in its memory 818, such as pre-process simulation 820 which would function as described above: Pre-process simulation 820 may itself simulate an NC program, or may extract relevant data from execution of NC simulation 822. Predicted values calculated by pre-process simulation 820 may be calculated predicted values which may be provided to real time monitoring 814.

In an operating environment such as shown in FIG. 8, the depicted components and programs could be implemented in, and interact with, each other in a variety of different types of hardware which could be used to implement the various illustrated components. For example, processors such as illustrated in FIG. 8 could be implemented using microprocessors, microcontrollers, digital signal processors (DSPs), field programmable gate arrays (FPGAs), programmable logic devices (PLDs), programmable logic controllers (PLCs), state machines, gated logic, discrete hardware circuits, and other suitable hardware configured to perform the various functionality described throughout this disclosure. Similarly, a program such as the pre-process simulation 820 or real time monitoring program 814 may take actions which would influence the operation of an NC program or simulation in a variety of ways in addition to (or as an alternative to) acting as a hypervisor. For example, a monitoring program could implement a remedial action using a parallel communication path, such as real time monitoring program 814 causing a command to be sent to the machine tool 802 which would override (e.g., a command to shut down) or modify the impact of (e.g., a command to slow down or pause for a set period of time) the commands based on NC program 812. As another alternative, a monitoring program could integrate execution of another program into its own operation (e.g., by a pre-process simulation 820 invoking simulation program 822 from its own code by means of API calls), which would allow it direct control over the integrated program's execution. Other approaches for allowing actions by a monitoring program to influence operation of another program (e.g., messages from the monitoring program being treated as interrupts by the device which is executing it) are also possible.

Variations on the operating environment of FIG. 8 are also possible. For example, while FIG. 8 illustrates real time monitoring program 814 and NC program 812 both being executed by machine tool controller 804, in some embodiments these programs could be executed on physically distinct devices, with the device executing real time monitoring program 814 receiving information on machine tool 802 either indirectly through machine tool controller 804, or directly via a separate connection with machine tool 802 itself. Other variations are also possible, such as embodiments in which various programs are be executed on multiprocessor systems rather than single processor systems as shown in FIG. 8, and embodiments which use different types of memories to store the illustrated programs (e.g., optical media, magnetic media, RAID arrays, removable drives, etc). Accordingly, the operating environment of FIG. 8 and the accompanying description should be understood as being illustrative only, and should not be treated as implying limitations on the protection provided by this document or any other document which relies in whole or in part on this disclosure.

In accordance with various aspects of the disclosure, an element, or any portion of an element, or any combination of elements may be implemented with a "processing system" that includes one or more physical devices comprising processors. Examples of processors include microprocessors, microcontrollers, digital signal processors (DSPs), field programmable gate arrays (FPGAs), programmable logic devices (PLDs), programmable logic controllers (PLCs), state machines, gated logic, discrete hardware circuits, and other suitable hardware configured to perform the various functionality described throughout this disclosure. One or more processors in the processing system may execute processor-executable instructions. A processing system that executes instructions to effect a result is a processing system which is configured to perform tasks causing the result, such as by providing instructions to one or more components of the processing system which would cause those components to perform acts which, either on their own or in combination with other acts performed by other components of the processing system would cause the result. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. Computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

EXPLICIT DEFINITIONS

"Based on" means that something is determined at least in part by the thing that it is indicated as being "based on." When something is completely determined by a thing, it will be described as being "based exclusively on" the thing.

"Processor" means devices which can be configured to perform the various functionality set forth in this disclosure, either individually or in combination with other devices. Examples of "processors" include microprocessors, microcontrollers, digital signal processors (DSPs), field programmable gate arrays (FPGAs), programmable logic devices (PLDs), programmable logic controllers (PLCs), state machines, gated logic, and discrete hardware circuits. The phrase "processing system" is used to refer to one or more processors, which may be included in a single device, or distributed among multiple physical devices.

"Instructions" means data which can be used to specify physical or logical operations which can be performed by a processor. Instructions should be interpreted broadly to include, code, code segments, program code, programs, subprograms, software modules, applications, software applications, software packages, routines, subroutines, objects, dynamic linked libraries, executables, threads of execution, procedures, functions, hardware description language, middleware, etc., whether encoded in software, firmware, hardware, microcode, or otherwise.

A statement that a processing system is "configured" to perform one or more acts means that the processing system includes data (which may include instructions) which can be used in performing the specific acts the processing system is "configured" to do. For example, in the case of a computer (a type of "processing system") installing Microsoft WORD on a computer "configures" that computer to function as a word processor, which it does using the instructions for Microsoft WORD in combination with other inputs, such as an operating system, and various peripherals (e.g., a keyboard, monitor, etc.).

The foregoing description has been presented for purposes of illustration and description of this invention. It is not intended to be exhaustive or to limit the invention to the precise form disclosed. Examples given, such as involving the use of phrases such as "for example", "by way of example" and "an example", are to be interpreted as non-limiting. Obvious modifications or variations are possible in light of the above teachings. The embodiment was chosen and described in order to best illustrate the principles of the invention and their practical application to thereby enable one of ordinary skill in the art to utilize the invention in various embodiments and forms, and with various modifications as are suited to the particular use contemplated. Although only a limited number of embodiments is explained in detail, it is to be understood that the invention is not limited in its scope to the details of construction and arrangement of components set forth in the preceding description or illustrated in the drawings. The innovation is capable of being practiced or carried out in various ways and in various forms and other embodiments. Also specific terminology was used for the sake of clarity. It is to be understood that each specific term includes all technical equivalents which operate in a similar manner to accomplish a similar purpose. It is intended that the scope of the invention be defined by the claims submitted herewith.

The invention claimed is:

1. A method of monitoring operation of a machine tool, the method comprising:
   a. simulating execution of a plurality of motion steps corresponding to a NC program;
   b. for at least one respective simulated operating condition corresponding to each respective one of a plurality of the plurality of motion steps, determining during the step of simulating at least one respective predicted value for each of the at least one simulated operating condition;
   c. determining at least one respective actual value of a respective operating condition experienced by said machine tool during operation;
   d. comparing said at least one respective actual value to the at least one respective predicted value of the simulated operating condition corresponding to the respective operating condition associated with the at least one respective actual value; and
   e. adjusting operation of the machine tool if based on the comparison said at least one actual value is not within a range containing the respective predicted value.

2. The method of claim 1, wherein at least one of said respective operating condition comprises a machine tool operating condition.

3. The method of claim 2, wherein said machine tool operating condition comprises a tool operating condition.

4. The method of claim 1, wherein said respective operating condition is selected from the group consisting of radial load on a tool holder of the machine tool, bending moment on the tool holder, bending moment at the tool holder/spindle interface, spindle power, torque of the machine tool, load on one or more axis servo of the machine tool and temperature of the tool.

5. The method of claim 1, comprising determining at least one respective actual temperature value of a tool used in the operation of the machine tool and comparing said actual temperature value to a predicted value corresponding to temperature of the tool.

6. The method of claim 1, wherein operation of the machine tool causes a tool carried by the machine tool to move along a tool path, the tool path comprising a plurality of sequential tool positions, and wherein the steps of determining at least one respective actual value of a respective operating condition and of comparing at least one respective actual value are repeated for a plurality of the plurality of sequential tool positions.

7. The method of claim 1, wherein operation of the machine tool causes a tool carried by the machine tool to move along a tool path, the tool path comprising a plurality of sequential tool positions, and wherein each respective predicted value is dependent on the tool position of the tool.

8. The method of claim 1, wherein the step of comparing comprises comparing the at least one respective actual value to a respective range containing the at least one respective predicted value.

9. The method of claim 1, wherein the step of determining at least one respective predicted value occurs prior to actual operation of the machine tool.

10. The method of claim 1, wherein the step of determining at least one respective predicted value occurs after actual operation of the machine tool has started.

11. The method of claim 1, comprising executing the NC program to cause operation of the machine tool.

12. The method of claim 1, wherein each at least one respective actual value has an associated tool position, and the step of comparing comprises associating the associated tool position with a respective one of the plurality of the plurality of motion steps.

13. The method of claim 1, wherein at least one of said associated respective operating condition comprises a tool operating condition.

14. The method of claim 1, wherein the step of adjusting operation of the machine tool comprises adjusting the tool feed rate.

15. A method of monitoring operation of a machine tool, wherein operation of the machine tool causes a tool carried by the machine tool to move along a tool path, the tool path comprising a plurality of sequential tool positions, the method comprising:
   a. simulating operation of the machine tool on a computer;
   b. for at least one respective simulated operating condition corresponding to each respective one of a plurality of the plurality of sequential tool positions, determining during the simulating step at least one respective predicted value for each of the at least one simulated operating condition;
   c. determining at least one actual value of a respective operating condition experienced by said machine tool during operation while at an associated one of said plurality of sequential tool positions;
   d. comparing the at least one actual value to the at least one respective predicted value of the simulated operating condition corresponding to the respective operating condition associated with the at least one respective actual value; and e. adjusting operation of the machine tool if based on the comparison said at least one actual value is not within a range containing the respective predicted value.

16. The method of claim 15, wherein the steps of determining at least one actual value and of comparing at least one actual value are repeated for a plurality of the plurality of sequential tool positions.

17. The method of claim 15, wherein the step of comparing at least one of the at least one predicted value to an actual value comprises comparing the at least one of the at least one respective actual value to a range containing the predicted value.

18. A machining system comprising:
  a. a real machine tool, the real machine tool configured to provide, to a monitoring system, for each respective one of a plurality of sequential tool positions at least one respective actual value of each of at least one operating condition resulting from operation of the machine tool at that respective one of the plurality of sequential tool positions;
  b. a computer configured to:
     i. simulate operation of the machine tool by modeling the execution of a plurality of motion steps corresponding to a NC program; and
     ii. for at least one respective simulated operating condition corresponding to each respective one of a plurality of the plurality of motion steps, calculate at least one respective predicted value for each of the at least one simulated operating condition;
  c. the monitoring system configured to:
     i. compare each respective actual value to the predicted value of the corresponding simulated operating condition that corresponds to the operating condition of the respective actual value at the tool position that matches the motion step; and
     ii. send a command to the real machine tool if the compared respective actual value falls outside of a range which contains the predicted value; and
  d. the machine tool configured to act in response to said command, the act being selected from the group consisting of adjusting tool feed rate and stopping the operation of the tool.

19. The machining system of claim 18, wherein the real machine tool is configured to adjust tool feed rate based on content of the command sent by the monitoring system.

20. The machining system of claim 18, wherein the monitoring system is configured to send said command if said respective actual value falls outside of the range for more than a predetermined period of time.

21. The machining system of claim 18, comprising a display, the machining system configured to display via the display the actual value of a plurality of the at least one operating condition experienced by said machine tool at and prior to a current tool position.

22. The machining system of claim 18, wherein the machining system is configured to display via the display a plurality of respective ranges for the current tool position and for previous tool positions and future tool positions, each respective range containing the respective actual predicted values for the current, previous and future tool positions.

23. The machining system of claim 18, wherein the operating condition of at least one of the at least one respective actual value is selected from the group consisting of radial load on a tool holder of the machine tool, bending moment on the tool holder, spindle power, bending moment at the tool holder/spindle interface, torque of the machine tool, load on one or more axis servo of the machine tool and temperature of the tool.

24. A machining system comprising:
  a. a real machine tool comprising a machine tool controller, the real machine tool configured:
     i. to operate at least one tool to machine a workpiece; and
     ii. to provide at least one respective actual value of an associated operating condition experienced by said machine tool during operation;
  b. a computer configured to
     i. simulate a plurality of simulated operating conditions by simulating execution of instructions; and
     ii. determine, by simulating execution of the instructions, at least one respective predicted value corresponding to a respective one of the plurality of simulated operating conditions;
  c. a monitoring system configured to
     i. compare said at least one respective actual value to the respective predicted value of the simulated operating condition that corresponds to said associated operating condition; and
     ii. send a command to said machine controller if said at least one respective actual value is not within a range containing the respective predicted value for more than a predetermined period of time; and
  d. the machine tool controller configured to act in response to said command, the act comprising adjusting operation of the machine tool.

25. The machining system of claim 24, wherein said machine tool controller is configured to provide data indicative of said at least one respective actual value.

26. The machining system of claim 24, wherein said machine tool comprises at least one sensor which senses the respective actual value of the associated operating condition.

27. The machining system of claim 24, wherein adjusting operation of the machine tool comprises adjusting tool feed rate.

28. The machining system of claim 24, wherein said predetermined period of time is zero seconds.

29. The machining system of claim 24, wherein adjusting operation of the machine tool comprises adjusting the feed rate of the tool.

30. The machining system of claim 24, wherein the machine tool controller is configured to execute a NC program to cause said at least one tool to move along a tool path.

31. The machining system of claim 24, wherein adjusting operation of the machine tool comprises stopping the operation of the machine tool.

32. A machining system comprising:
  a. a real machine tool, the real machine tool configured to provide for each respective one of a plurality of sequential tool positions at least one respective actual value of each of at least one operating condition experienced by said machine tool during operation of the machine tool at that respective one of the plurality of sequential tool positions;
  b. a computer configured to
     i. simulate a plurality of simulated operating conditions by simulating execution of instructions; and
     ii. determine, by simulating execution of the instructions, at least one respective predicted value corresponding to a respective one of the plurality of simulated operating conditions;

c. a monitoring system configured to compare said at least one respective actual value to the respective predicted value of the simulated operating condition that corresponds to said associated operating condition, and d. the machine tool configured to adjust operation of the machine based on an indication that said at least one actual value is not within a range containing the respective predicted value.

33. The machining system of claim 32, wherein the monitoring system is configured to compare said at least one respective actual value to the respective predicted value of the simulated operating condition comprises the monitoring system being configured to compare the at least one respective actual value to a range containing the respective predicted value of the simulated operating condition.

34. The machining system of claim 33, comprising a display, the machining system configured to display via said display the actual value of a plurality of the at least one operating condition experienced by said machine tool at and prior to a current tool position.

35. The machining system of claim 34, wherein the machining system is configured to display via the display a plurality of respective ranges for the current tool position and for previous tool positions and future tool positions, each respective range containing the respective actual predicted values for the current, previous and future tool positions.

* * * * *